(12) United States Patent
Heo et al.

(10) Patent No.: US 8,277,670 B2
(45) Date of Patent: Oct. 2, 2012

(54) PLASMA PROCESS WITH PHOTORESIST MASK PRETREATMENT

(75) Inventors: Dongho Heo, Fremont, CA (US); Ji Soo Kim, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1177 days.

(21) Appl. No.: 12/120,059

(22) Filed: May 13, 2008

(65) Prior Publication Data

US 2009/0286400 A1    Nov. 19, 2009

(51) Int. Cl.
*H01L 21/3205* (2006.01)
(52) U.S. Cl. ............... 216/41; 438/694; 257/E21.294; 156/345.25
(58) Field of Classification Search .............. None
See application file for complete search history.

(56) References Cited

U.S. PATENT DOCUMENTS

| | | | |
|---|---|---|---|
| 4,253,888 A | 3/1981 | Kikuchi | |
| 6,326,307 B1 | 12/2001 | Lindley et al. | |
| 7,241,683 B2 | 7/2007 | Hudson et al. | |
| 7,271,107 B2 | 9/2007 | Marks et al. | |
| 7,390,753 B2* | 6/2008 | Lin et al. | 438/725 |
| 7,838,426 B2* | 11/2010 | Goyal et al. | 438/694 |
| 2006/0172540 A1* | 8/2006 | Marks et al. | 438/700 |
| 2007/0111110 A1* | 5/2007 | Lin et al. | 430/5 |
| 2007/0181530 A1 | 8/2007 | Huang et al. | |
| 2008/0083502 A1* | 4/2008 | Heo et al. | 156/345.24 |
| 2009/0050271 A1* | 2/2009 | Goyal et al. | 156/345.25 |
| 2011/0030895 A1* | 2/2011 | Goyal et al. | 156/345.3 |
| 2011/0104616 A1* | 5/2011 | Cheng et al. | 430/323 |

FOREIGN PATENT DOCUMENTS

WO    2007/005204    1/2007

OTHER PUBLICATIONS

Search Report dated Nov. 23, 2009 for International Application No. PCT/US2009/043165.
Written Opinion dated Nov. 23, 2009 for International Application No. PCT/US2009/043165.
Kim et al., "Effects of various plasma pretreatments on 193 nm photoresist and linewidth roughness after etching", J. Vac. Sci. Technol. B, vol. 24, No. 6, Nov./Dec. 2006, pp. 2645-2652.

* cited by examiner

*Primary Examiner* — Allan Olsen
(74) *Attorney, Agent, or Firm* — Beyer Law Group LLP (57) ABSTRACT

A method for etching features in a dielectric layer through a photoresist (PR) mask is provided. The PR mask is patterned using laser light having a wavelength not more than 193 nm. The PR mask is pre-treated with a noble gas plasma, and then a plurality of cycles of a plasma process is provided. Each cycle includes a deposition phase that deposits a deposition layer over the PR mask, the deposition layer covering a top and sidewalls of mask features of the PR mask, and a shaping phase that shapes the deposition layer deposited over the PR mask.

19 Claims, 11 Drawing Sheets

PLASMA PROCESS WITH PHOTORESIST MASK PRETREATMENT

BACKGROUND OF THE INVENTION

The invention relates to the formation of semiconductor devices. More specifically, the invention relates to the formation of semiconductor devices by etching features in an etch layer through a photoresist (PR) mask.

During semiconductor wafer processing, features of the semiconductor device are defined in the wafer using well-known patterning and etching processes. In these processes, a photoresist (PR) material is deposited on the wafer and then is exposed to light filtered by a reticle. The reticle may be a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Argon-fluoride (ArF) excimer laser having wavelength of 193 nm has been used to produce most highly integrated circuits such as sub 0.04 μm devices. This technology, combined with immersion lithography (ArF lithography), enables processes below the 110 nm node. Such small circuit features require higher resolution and thus a thinner photoresist because of the depth-of-focus (depth-of-field) limitations of the patterning image. For example, the ArF lithography for certain DRAM processes, such as Bitline, uses a very thin photoresist with a thickness less than 100 nm. The photoresist material is also softer and weaker, and such a thin and weak photoresist mask would easily and undesirably be etched or damaged during a plasma process after the patterned photoresist mask is provided.

SUMMARY OF THE INVENTION

To achieve the foregoing and in accordance with the purpose of the present invention, a method for etching features in a dielectric layer through a photoresist (PR) mask is provided. The PR mask is patterned using laser light having a wavelength not more than 193 nm. The PR mask is pre-treated with a noble gas plasma, and then a plurality of cycles of a plasma process is provided. Each cycle includes a deposition phase that deposits a deposition layer over the PR mask, the deposition layer covering a top and sidewalls of mask features of the PR mask, and a shaping phase that shapes the deposition layer deposited over the PR mask.

In one aspect of the invention, the noble gas may comprise Ar. Pre-treating the PR mask may include providing the noble gas, forming a plasma from the noble gas, and stopping a flow of the noble gas. In forming the plasma, a high frequency of 60 MHz or greater may be provided. In one aspect of the invention, the forming the plasma does not provide RF energy with a frequency less than 50 MHz.

In another manifestation of the invention, an apparatus for etching features in a dielectric layer through a photoresist (PR) mask is provided. The PR mask is patterned using laser light having a wavelength not more than 193 nm. The apparatus comprises a plasma processing chamber. The plasma process chamber includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. The apparatus further comprises a gas source in fluid connection with the gas inlet, which includes an etch gas source, a deposition phase gas source, a shaping phase gas source, and a pretreatment gas source. A controller is controllably connected to the gas source and the at least one electrode. The controller includes at least one processor, and computer readable media including (a) computer readable code for pre-treating the PR mask with a noble gas plasma, which includes computer readable code for providing a noble gas from the pretreatment gas source, computer readable code for forming a plasma from the noble gas, and computer readable code for stopping a flow of the noble gas, and (b) computer readable code for providing a plurality of cycles, each cycle including a deposition phase and a shaping phase. The computer readable code (b) includes computer readable code for providing a deposition phase gas from the deposition phase gas source, computer readable code for forming a plasma from the deposition phase gas so as to deposit a deposition layer over the PR mask, the deposition layer covering a top and sidewalls of mask features of the PR mask, computer readable code for stopping a flow of the deposition phase gas, computer readable code for providing a shaping phase gas from the shaping phase gas source, computer readable code for forming a plasma from the shaping phase gas source so as to shape the deposition layer deposited over the PR mask, and computer readable code for stopping a flow of the shaping phase gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
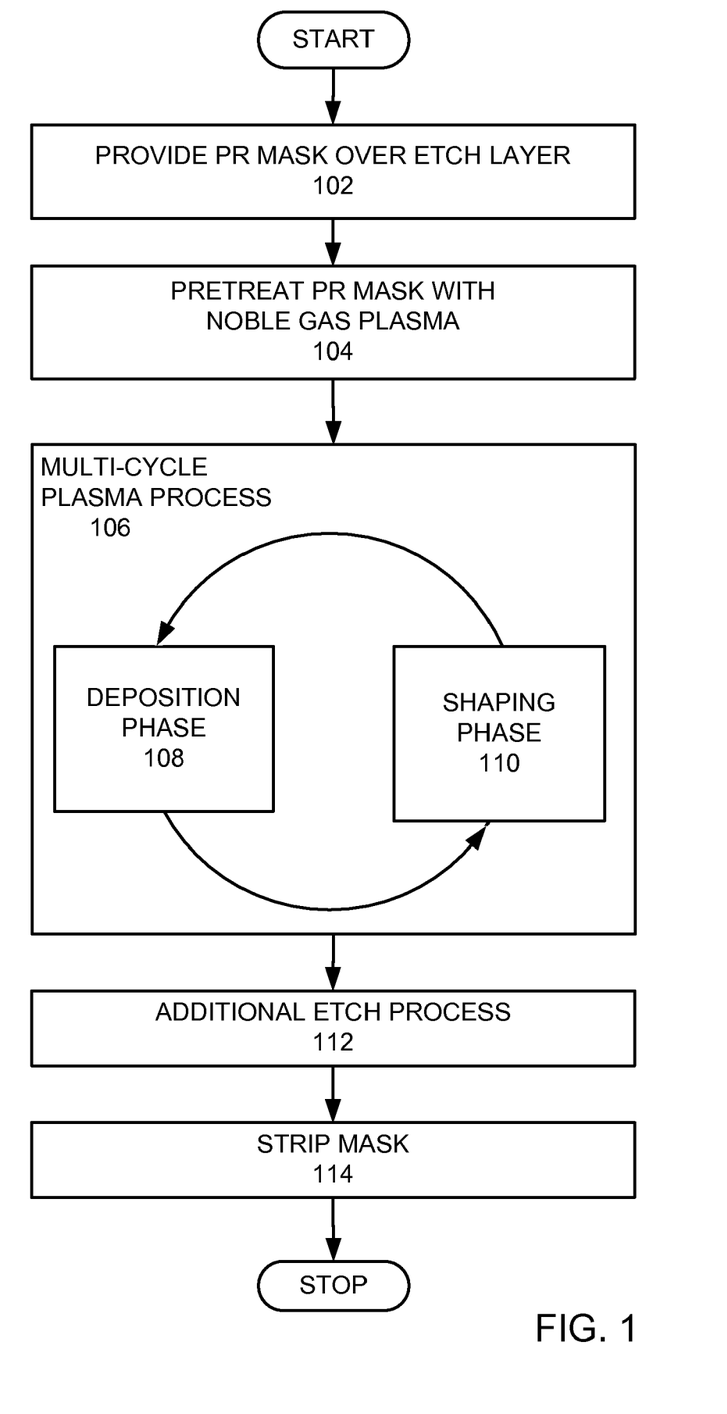
FIG. 1 is a high level flow chart of a plasma process with a PR mask pretreatment in accordance with one embodiment of the present invention.

To facilitate understanding, FIG. 1 is a high level flow chart of a plasma process with a PR mask pretreatment in accordance with one embodiment of the present invention. A patterned photoresist (PR) mask is provided over an etch layer (step 102).

Figure 2A:
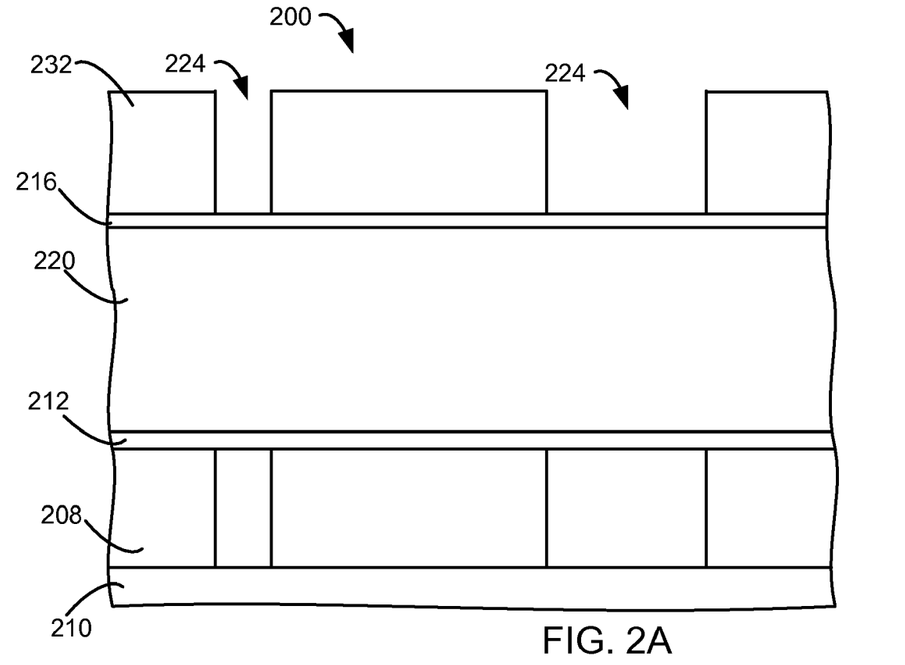
FIGS. 2A-D schematically illustrate cross-sectional views of the formation of features in a dielectric layer using a multi-cycle plasma process according to an example of the present invention.

FIG. 2A is a cross-sectional view of an example of a stack 200 processed in accordance with one embodiment of the present invention. The stack 200 includes an etch layer 220 formed over a barrier layer 212, which are formed over a wafer 210. In this example, a layer 208 is disposed between the barrier layer 212 and the wafer 210. Although the layer 208 is shown as being formed on the wafer 210, there may be any number of layers formed between the etch layer 220 and the wafer 210. In this example, the barrier layer 212 may be a silicon carbide (SiC) layer or it may also be SiN. The etch layer 220 may be a low-k dielectric, such as organosilicate dielectrics and porous dielectric, including CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif.; HOSP™ from Allied Signal of Morristown, N.J.; SiLK™ or advanced porous SiLK from DOW Chemical Company; Orion® Flowfill™ from Trikon; and LKD™ from JSR Corp.

The formation of mask features 224 may be performed by forming an anti-reflective layer (ARL) 216 over the etch layer 220. The ARL 216 may be formed by spin-on deposition. A photoresist mask 232 is provided over the ARL 216 (step 102). The photoresist mask 232 may be patterned by exposing a photoresist layer to a patterned light and then developing the photoresist layer 232 to obtain mask features 224 in the photoresist layer. Preferably, the PR mask is formed using an ArF (193 nm) photoresist, combined with immersion lithography (ArF lithography technology). The ArF PR is suitable to produce most highly integrated circuits such as sub 0.04 μm devices. More generally, the PR mask 232 may be patterned using laser light having a wavelength not more than 193 nm.

Since the ArF PR mask is thin and weak, the subsequent plasma process typically uses high density plasma with low ion energy in order to prevent damages or wiggling of the PR mask. Typically, Applicants use a multi-cycle two-phase plasma process which is capable of controlling PR mask shapes and/or profiles. However, in such a high-density low-energy plasma, numerous low-energy ions bombard the PR mask so as to increase outgassing of solvents in the PR material, which causes "blistering" (pealing-off) of the PR mask. It is believed that blistered PR masks tend to release the PR material (particles) into plasma during the plasma process, contaminating the wafer and resulting integrated circuits. The contaminating particle problems in plasma etch processes using 193 nm ArF PR and the source of the undesirable particles had been long studied, and Applicants finally found that the blistering of the PR mask was the major cause of the particles problems. Applicants also found that pre-treating the PR mask with a noble gas plasma under certain conditions unexpectedly reduced blistering of the PR mask in a subsequent plasma process or processes.

Thus, in accordance with one embodiment of the present invention, in order to reduce or minimize the blistering and resulting particle problems, the PR mask 232 is pretreated with a noble gas plasma (step 104) before the stack 200 is proceed by a multi-cycle plasma process (step 106), as shown in FIG. 1. Preferably, the noble gas is pure argon (Ar), but helium (He), xenon (Xe) or other noble gas may be used.

After the pretreatment (step 104), the multi-cycle plasma process (step 106) is performed, preferably and advantageously, in the same plasma chamber. The multi-cycle plasma process (step 106) provides a plurality of cycles, where each cycle includes a deposition phase 108 and a shaping phase 110. The deposition phase 108 deposits a deposition layer over the PR mask, where the deposition layer covers at least the top and sidewalls of mask features of the PR mask. The shaping phase 110 shapes the deposition layer deposited over the PR mask. After the multi-cycle plasma process 106, additional etch process(es) may be performed (step 112), and the PR mask may be stripped (step 114) using any stripping or ashing process.

Figure 2B:
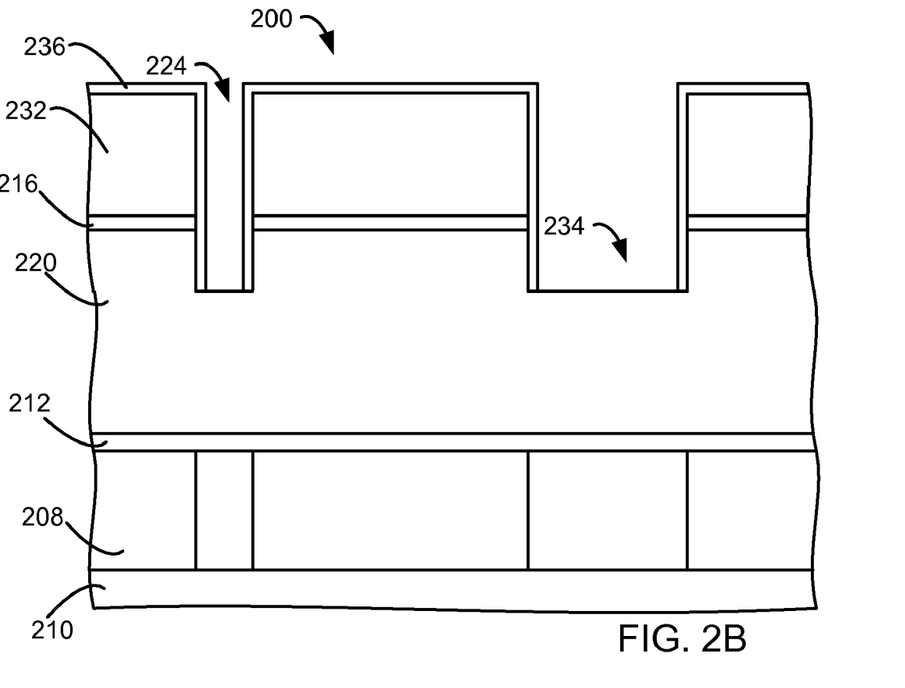
Figure 2C:
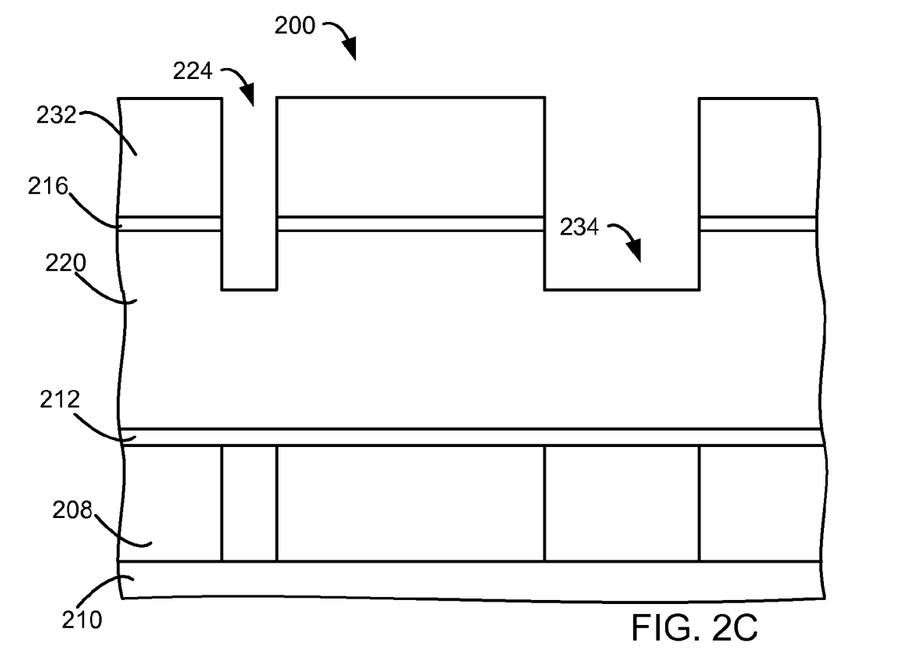
Figure 2D:
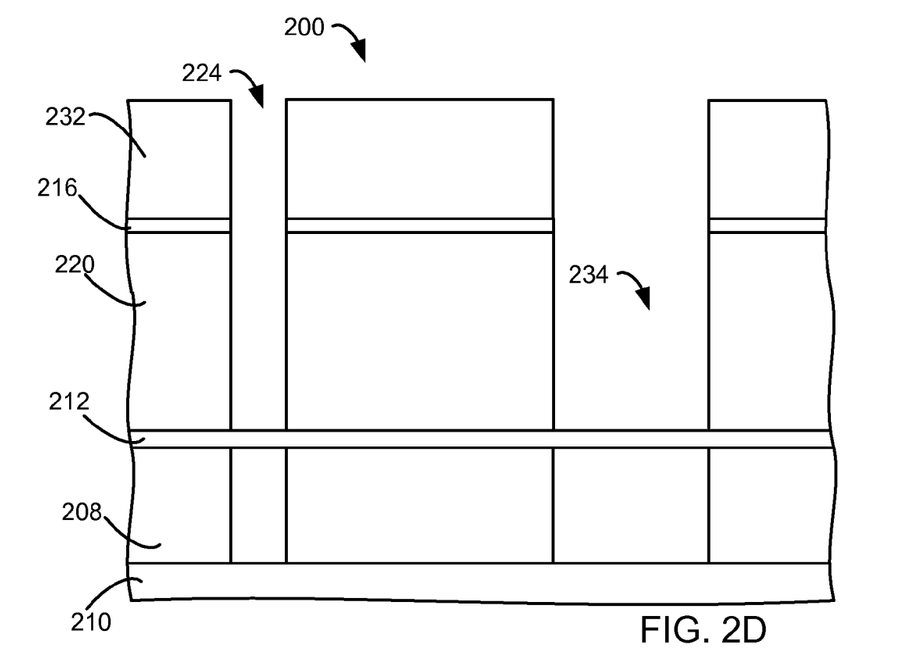
Figure 3A:
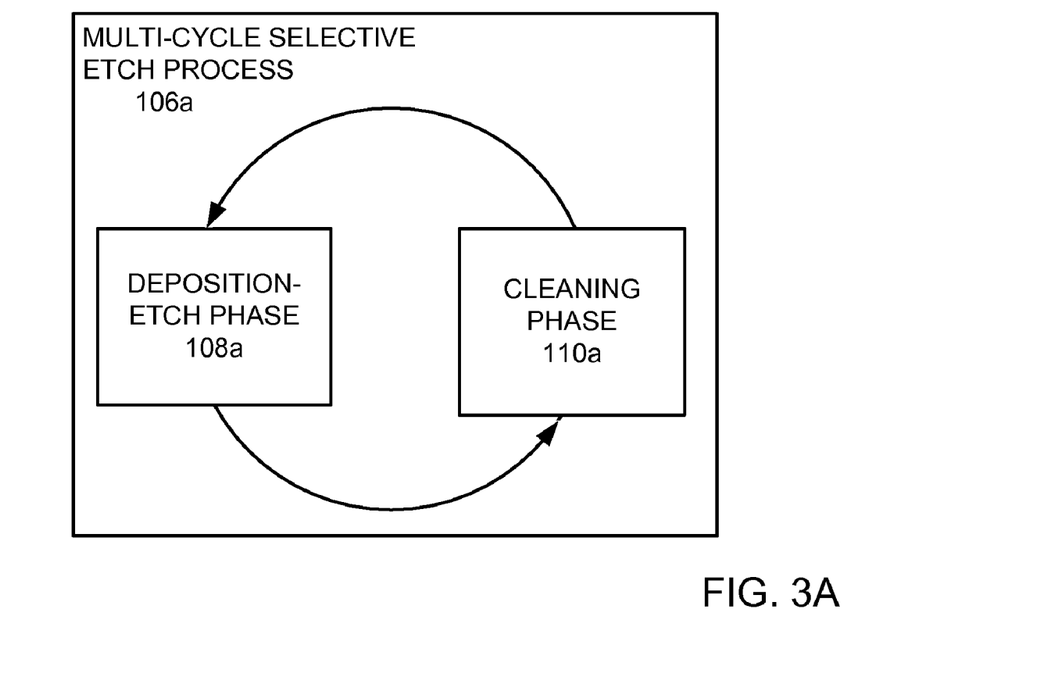
FIGS. 3A-D schematically illustrate examples of the multi-cycle, two phase plasma process in accordance with embodiments of the present invention.

In an example of the present invention shown in FIGS. 2B-2D, features 234 are selectively etched into the etch layer 220 by the multi-cycle plasma process 106. FIG. 3A schematically illustrates the multi-cycle plasma process (the selective-etch process 106a) in this example. As shown in FIG. 3A, the deposition phase 108 is a deposition-etch phase 108a that selectively etches the etch layer 220 with respect to the PR mask 232 and deposits a deposition layer (polymer) over the PR mask 232 and on sidewalls of the etched feature 234. FIG. 2B schematically illustrates a cross-sectional view of the stack 200 after a deposition-etch phase 108a. One or more etch cycles may have already been performed to obtain the structure shown in FIG. 2B. The deposition-etch phase 108a etches part of the features 234, while depositing a polymer layer 236 over the sidewalls of the etched features 234 and over the photoresist mask 232. Such a deposition-etch phase preferably provides an infinite selectivity, since such a phase etches the etch layer 220 without etching the photoresist mask 232, but instead forming the polymer layer 236 over the photoresist mask 232.

In this example, as shown in FIG. 3A, the shaping phase 110 is a polymer cleaning phase 110a that removes the deposited polymer 236. FIG. 2C is a cross-sectional view of the stack 200 after a polymer cleaning phase 110a. One or more cycles of the two-phase process may have already been performed to obtain the structure shown in FIG. 2C. The polymer cleaning phase 110a removes the deposited polymer 236 on the sidewalls of the etched feature 234 and on the mask feature 224. In the preferred embodiment, the etch layer 220 is not etched during the polymer cleaning phase 110a. In other embodiments, the polymer cleaning phase 110a may etch the etch layer 220 at the bottom of the features 234.

The multi-cycle plasma process 106a is preferably performed for 10 to 100 cycles. More preferably, the multi-cycle plasma process 106*a* is performed for 15 to 50 cycles. Most preferably, the multi-cycle plasma process is performed for about 20 cycles.

FIG. 2D is a cross-sectional view of the stack 200 after the selective etch process (step 106*a*) is completed. In this example, the features 234 are etched entirely through the etch layer 220. The photoresist mask 232 has not been etched, providing an infinite selectivity.

The photoresist mask 232 is then stripped (FIG. 1, step 114).

Preferably, the sidewalls of the etched features 234 are vertical. Preferably, the vertical sidewalls are sidewalls that from bottom to top make an angle between 88° to 90° with the bottom of the features. It should be noted that without the polymer cleaning phase (step 110*a*), a continuous deposition-etch phase 108*a* would continue to add more polymer on the sidewalls of the features 234. As a result, the widths of the features would decrease creating tapered instead of vertical sidewalls. Such a process would cause a stop etch, which would limit the depth of the etch.

Preferably, the etch layer 220 is a dielectric layer. More preferably, the etch layer is a low-k dielectric layer. The dielectric layer may be a low k silicon oxide based dielectric layer. In an example of a preferred embodiment of the invention, the substrate 210 is a silicon wafer and the dielectric etch layer 220 is OSG (organosilicate glass) or Coral. In the preferred embodiment, the barrier layer 212 is of SiC. The mask is formed (step 104) using an ArF (193 nm PR) photoresist. In the preferred embodiment, the ARC layer is a bottom antireflective coating (BARC).

Figure 4:
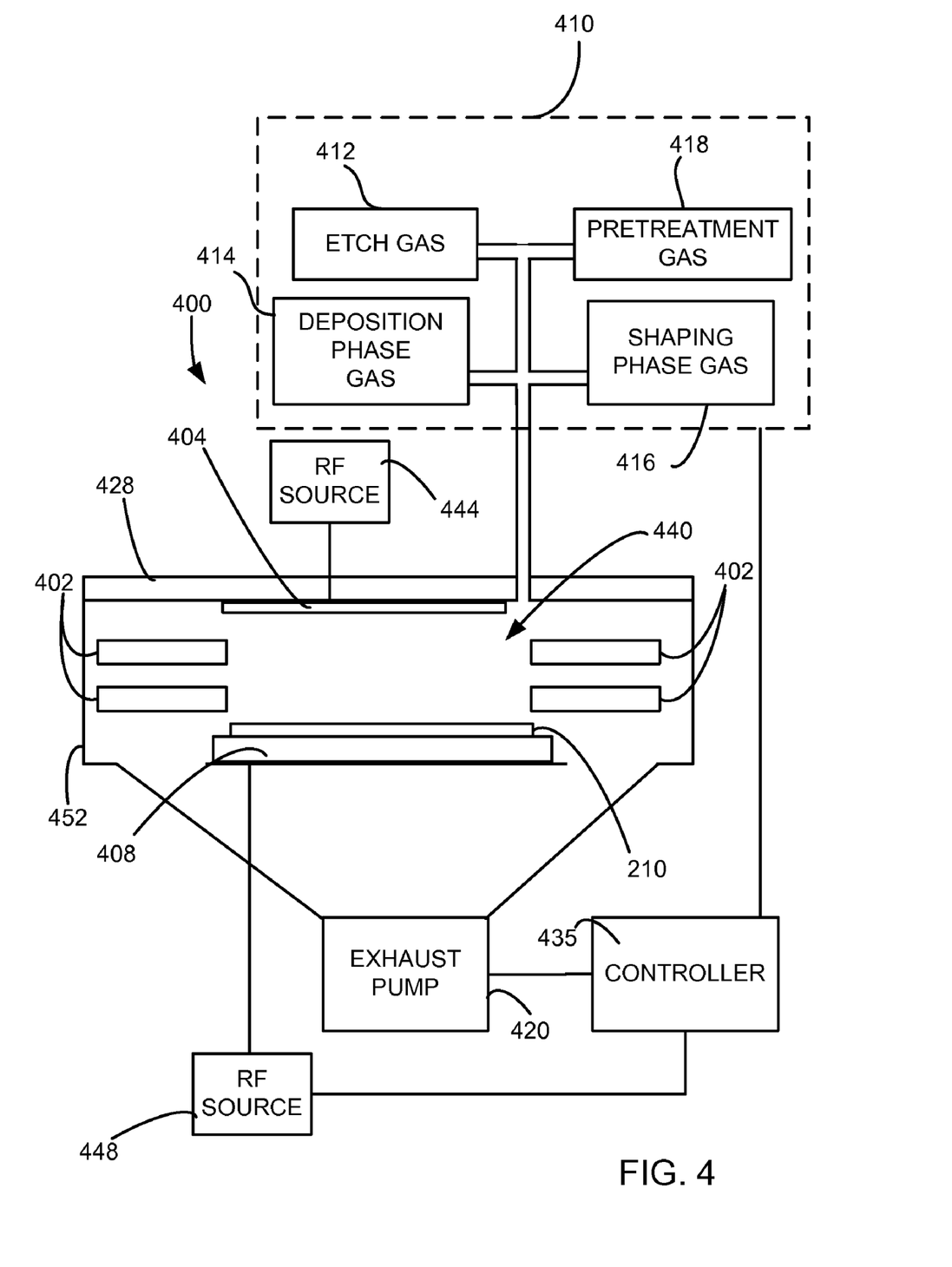
FIG. 4 is a schematic view of a plasma processing chamber that may be used for PR mask pretreatment, subsequent plasma process, and stripping.

FIG. 4 is a schematic view of a plasma processing chamber 400 that may be used for etching and stripping. The plasma processing chamber 400 comprises confinement rings 402, an upper electrode 404, a lower electrode 408, a gas source 410, and an exhaust pump 420. The gas source 410 may comprise an etch gas source 412, a deposition phase gas source 414, a shaping phase gas source 416, and a pretreatment gas source 418. Within plasma processing chamber 400, the substrate 210 is positioned upon the lower electrode 408. The lower electrode 408 incorporates a suitable substrate chucking mechanism (e.g., electrostatic, mechanical clamping, or the like) for holding the substrate 210. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume 440 by the gas source 410 and is exhausted from the confined plasma volume 440 through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 60 MHz power source, and a 2 MHz power source. For example, Lam Research Corporation's Dielectric Etch Systems such as Exelan® Series, made by LAM Research Corporation™ of Fremont, Calif., may be used in a preferred embodiment of the invention. Different combinations of connecting RF power to the electrode are possible. In a preferred embodiment of the invention, only the 60 MHz power source is used for the pretreatment as the second RF power source 448 connected to the lower electrode, and the upper electrode is grounded. A controller 435 is controllably connected to the RF sources 444, 448, exhaust pump 420, and the gas source 410. Such a device is capable of modulating the pressure of the chamber, gas flow, gas combinations, RF power, and time duration for each phase.

Figure 5A:
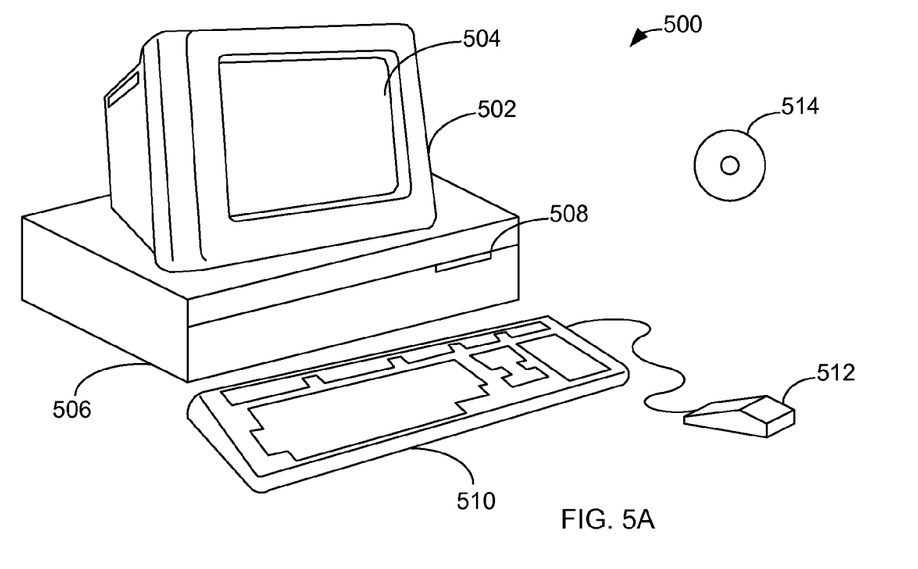
FIGS. 5A-B illustrate a computer system, which is suitable for implementing a controller used in embodiments of the present invention.
Figure 5B:
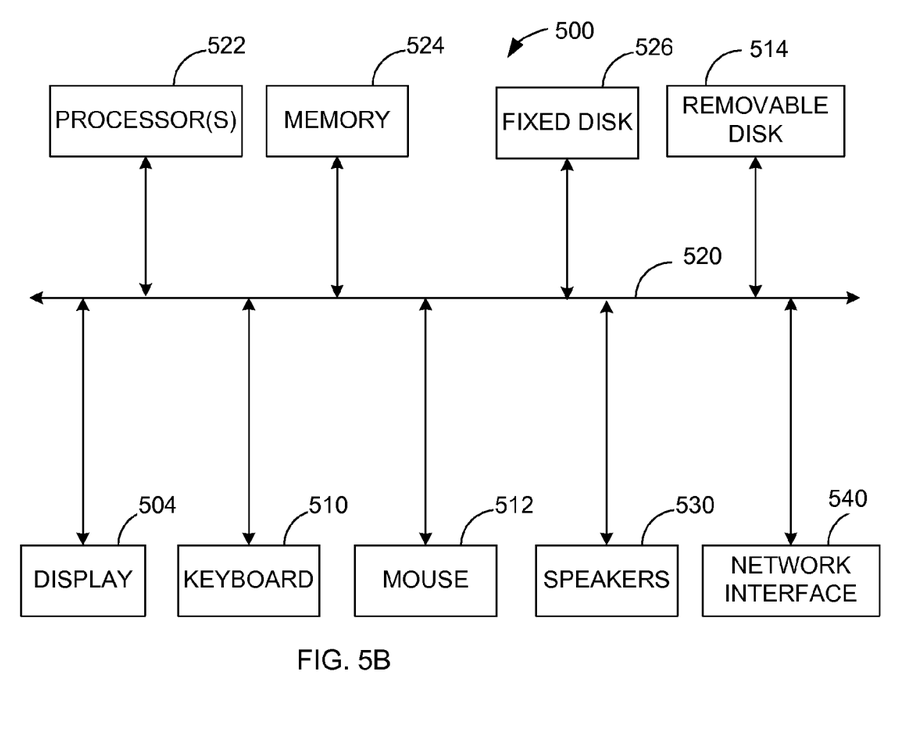

FIGS. 5A and 5B illustrate a computer system 500, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 are a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 6:
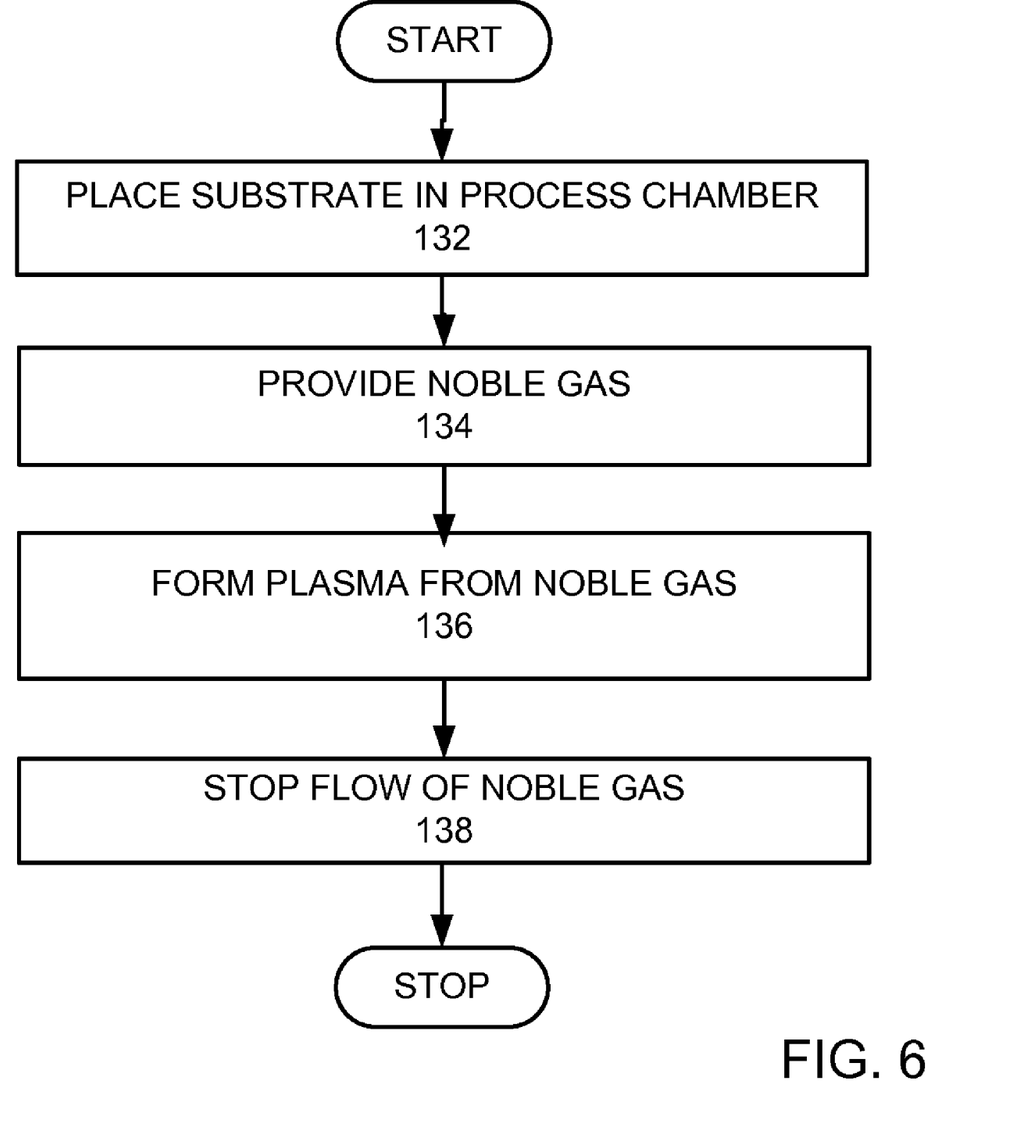
FIG. 6 is a detailed flow chart of the PR mask pretreatment in accordance with one embodiment of the present invention.

FIG. 6 schematically illustrates a detailed process flow of the pretreatment (step 104) of the PR mask. Typically, the substrate 210 with the stack of layers with the patterned PR mask thereon is placed in a plasma process chamber (step 132), such as the plasma processing chamber 400 described above. The noble gas is provided (step 134), a plasma is formed from the noble gas (step 136) to treat the PR mask, and then the flow of the noble gas is stopped (step 138). The subsequent multi-cycle plasma process may be performed without extinguishing the plasma, by changing the process gasses and other plasma condition parameters.

It is preferable to provide a high density plasma with low ion energy such that the PR mask is not etched or damaged during the pretreatment, but the PR mask is "tapped" by a number of low energy ions such that the soft or flaky PR mask is made harder and have a more solid structure. Preferably, the pretreatment gas contains Ar. More preferably, the pretreatment gas contains Ar only. For example, 100 to 1000 sccm Ar gas, preferably 700 sccm Ar gas may be provided. Alternatively, the pretreatment gas may contains Ar, He, and/or Xe, or a mixture thereof.

In forming a plasma from the pretreatment gas (step 136), a high frequency of 60 MHz or greater may be provided at the power range of 100 to 500 W. Preferably, the power is set at 300 W. The plasma forming step 136 does not provide RF energy with a frequency less than 50 MHz. When the ion energy cannot be directly controlled, the power range of 300 W and a high frequency of 60 MHz or greater ensure sufficiently low ion energy. The plasma chamber may be set at 100 mTorr or greater. Preferably, the pressure is set at about 200 mTorr.

It is believed that the low energy noble gas ions tap the top of the PR mask to press and harden the PR mask. This causes physical reactions, i.e., physically changes the property of the PR mask material to harden by compression, but does not cause chemical reactions. By hardening and/or pressing the PR mask, the blistering of the PR mask is reduced so as to avoid particle contamination in the subsequent multi-cycle plasma process.

It should be noted that it has been proposed to employ Ar plasma pretreatment on the 193 nm PR before the silicon etch process in order to reduce line width roughness (LWR) or line edge roughness (LER) of the etched features after the main silicon etch process. The stack to be etched includes a Si substrate, a $SiO_2$ hardmask, a bottom antireflection coating (BARC), and the PR. However, an Ar plasma pretreatment only controls the shape of the PR mask and/or the etched silicon features, and does not address any issues relating to the particle contamination during the specific multi-cycle two-phase etching process using high-density, low-energy plasma.

As described above, the multi-cycle selective etch process includes a plurality of cycles, where each cycle comprises a deposition phase (step 108) and a shaping phase (step 110). In accordance with one embodiment of the present invention, the deposition phase does not provide RF energy with a frequency less than 50 MHz. Preferably, the deposition phase provides a high frequency of 60 MHz or greater. Similarly, in accordance with one embodiment of the present invention, the shaping phase does not provide RF energy with a frequency less than 50 MHz. Preferably, the shaping phase provides a high frequency of 60 MHz or greater.

As shown in FIG. 3A, the multi-cycle plasma process 106 in this example selectively etches features into the etch layer 220 by the multi-cycle plasma process 106a. The deposition phase 108 is a deposition-etch phase 108a that selectively etches the etch layer with respect to the PR mask and deposits polymer (deposition layer) on sidewalls of the etched feature and over the PR mask. The shaping phase 110 is a polymer cleaning phase 110a that removes the deposited polymer.

In this selective-etch process 106a, an example recipe for a deposition-etch phase (step 108a) is as follows: A deposition-etch phase gas of 40 sccm of $CF_4$ and 90 sccm of $H_2$ is provided. The chamber pressure was set to 90 mTorr. 1200 W were provided by the 27 MHz RF source and 400 W were provided by the 2 MHz power source. In this example, the deposition-etch is simultaneously done as a single step. An example recipe for a polymer cleaning phase (step 110a) is as follows: A polymer cleaning phase gas of 300 sccm of $O_2$ is provided. The chamber pressure was set to 250 mTorr. 100 W were provided by the 27 MHz RF source and no power was provided by the 2 MHz power source.

The PR mask is then stripped (step 114, FIG. 1). An example of a mask strip provides strip gas of 10~3000 sccm of $O_2$. The chamber pressure was set to 5~500 mTorr. 100~1000 W were provided by the 2 MHz, 27 MHz RF source or combination of both 2 MHz and 27 MHz RF power source.

Figure 3B:
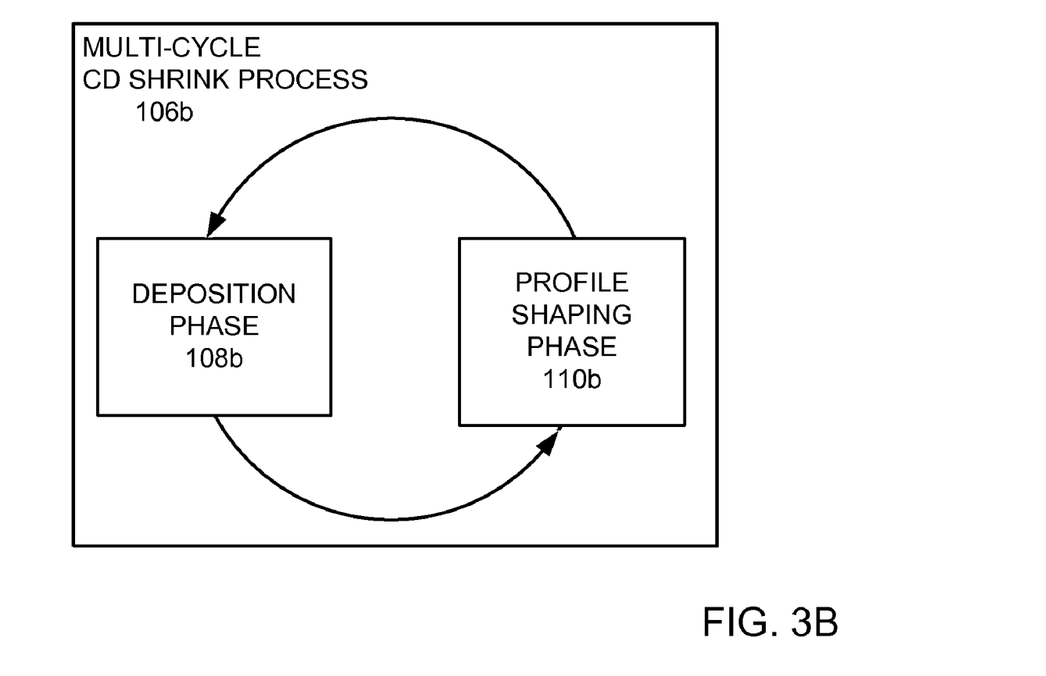
Figure 7A:
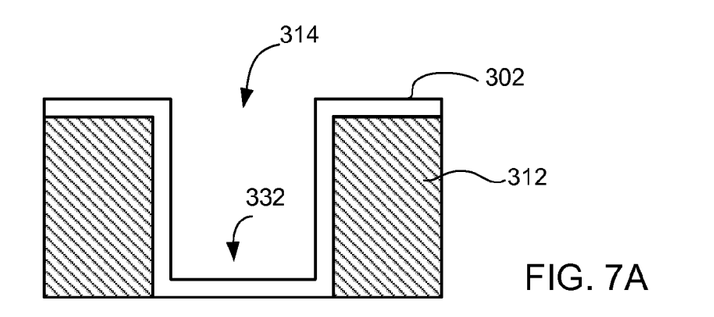
FIGS. 7A-D are schematic cross-sectional views of a mask feature processed using a multi-cycle plasma process according to an example of the present invention.
Figure 7B:
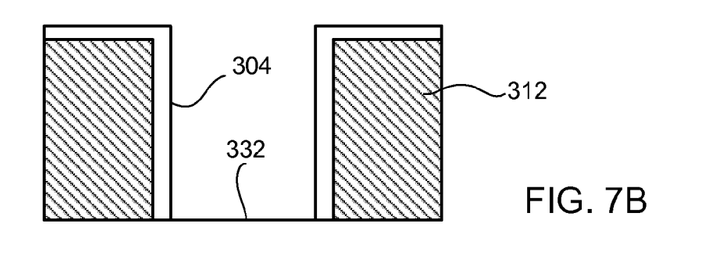
Figure 7C:
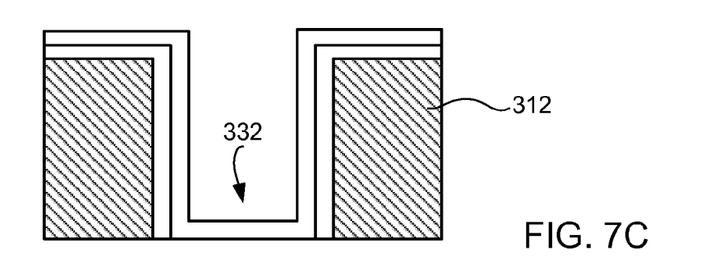
Figure 7D:
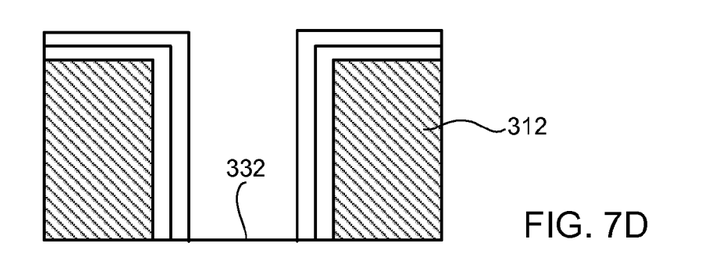

FIG. 3B schematically illustrates another example of the multi-cycle plasma process 106b in which the critical dimension (CD) of the PR mask is reduced. In this example, as shown in FIG. 7A, the deposition phase 108b further deposits the deposition layer 302 on a bottom 332 of the mask features 314, as well as over the PR mask 312. The shaping phase 110 is a profile shaping phase 110b that removes the deposition layer 302 from the bottom 332 of the mask features leaving the sidewalls 304 without etching the underlying dielectric layer so as to shrink the CD of the PR mask 312, as shown in FIG. 7B. The two-phase cycle is repeated, as shown in FIGS. 7C and 7D, until a desired CD of the mask features 314 is obtained. The dielectric is then etched using the shaped PR mask 312 with the CD shrunk by providing the plurality of cycles (FIG. 1, step 112). The PR mask 312 may be stripped (step 114) after the etch process.

One example of the deposition phase 108b may be $CF_4$ deposition using a chemistry of 60 sccm Ar, 75 sccm $CF_4$, and 100 sccm $H_2$ at a pressure of 70 mTorr, established by setting a Vat valve of the turbo pump to 1000. The 60 MHz RF source provides 200-800 Watts of power. This phase is maintained for about 12 seconds. One example of the shaping phase 110b may use a chemistry of 87 sccm $CF_4$, at a pressure of 25 mTorr, established by setting a Vat valve of the turbo pump to 1000. The 60 MHz RF source provides 200-800 Watts of power. This phase is maintained for about 3 seconds. The cyclic process using the deposition phase 108b and then the shaping phase 110b is performed for eight cycles.

The ability to control the ratio of times of the deposition phase 108b and the profile shaping phase 110b provide another control variable. A proper ratio will provide substantially vertical and conformal sidewalls. Such a deposition layer is also able to protect the photoresist mask to increase etch selectivity. Other control parameters provided by the invention that can be used to control the deposition profiles are: number of cycles, total deposition time, deposition/profile shaping time ratio, gas chemistry ratio (such as $CF_4/H_2$).

Other gas chemistries such as $C_4F_6/O_2$ or $CH_3F/N_2$ instead of $CF_4/H_2$ $CH_3F/O_2$ or $CH_3F/N_2$ instead of $CF_4$ etc. may be used.

Figure 3C:
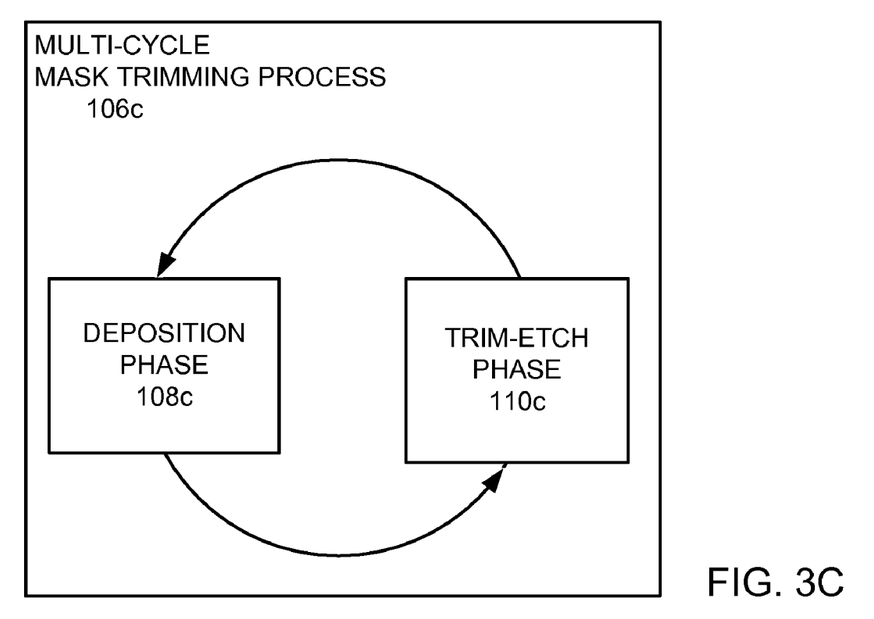

FIG. 3C schematically illustrates another example of the multi-cycle plasma process 106c in which the PR mask is trimmed. In this example, the deposition phase 108c further deposits the deposition layer on the bottom of the mask features, as well as over the PR mask. The shaping phase 110 is a trim-etch phase 110c that removes the deposition layer from the bottom and sidewall of the mask features, without etching the dielectric layer so as to trim the sidewall of the mask features.

Figure 8A:
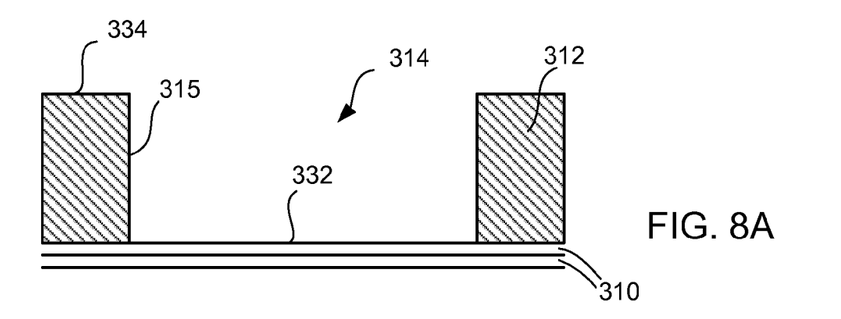
FIGS. 8A-D are schematic cross-sectional views of a mask feature processed using a multi-cycle plasma process according to another example of the present invention.
Figure 8B:
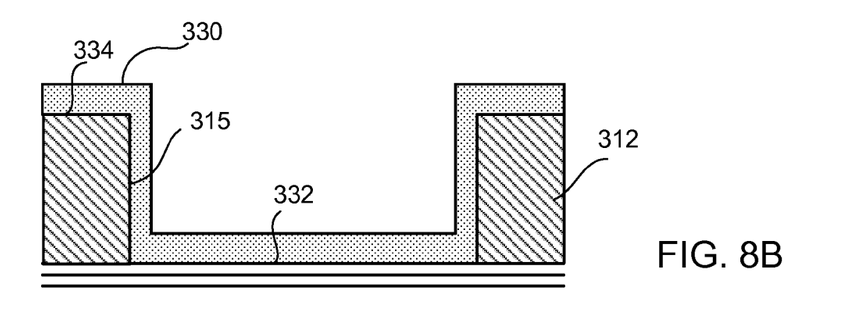

FIGS. 8A-8D schematically illustrates a cross sectional view of a mask feature 314 in each cycle. As shown in FIG. 8A, the patterned mask 312 is formed over the dielectric layer. Typically, an ARL 310 is provided on the top of the dielectric layer, which is exposed on the bottom 332 of the mask features 314. In this example, as shown in FIG. 8B, the deposition phase 108c further deposits the deposition layer 330 on the bottom 332 of the mask features 314, as well as over the PR mask 312. That is, the deposition layer 330 covers the bottom 332 of the mask features 314, as well as the sidewalls 315 of the mask features 314. The deposition layer may be a polymer. In each deposition phase 108c, in general, the thickness of the deposition layer 330 deposited on the top of the mask 312 and the thickness of the deposition layer 330 deposited on the bottom 332 of the mask features are greater than the thickness of the deposition layer deposited on the sidewall 315 of the mask features.

Figure 8C:
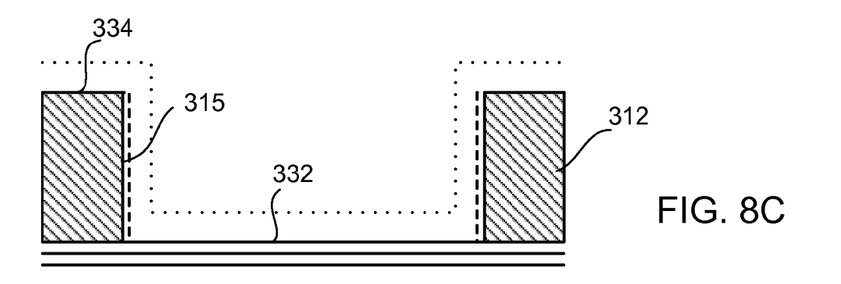

As shown in FIG. 8C, the trim-etch phase 110c removes the deposition layer 330 from the bottom 332 and sidewall 315 of the mask features without etching the dielectric layer so as to trim the sidewall of the mask features. The deposition layer 330 on the top 334 of the mask 312 is substantially removed in the trim-etch phase 110c. Since the deposition layer 330 is thinner on the sidewalls than on the top of the mask and the bottom of the mask features, the sidewall deposition is over etched into the sidewall of the mask features after the deposition layer 330 is removed from the sidewall. Preferably, for the top of the mask and the bottom of the mask features, the trim-etch phase removes only the deposition layer deposited in the previous deposition phase (making even), and does not etch the mask 312 or the ARL 310. By controlling the two phases, the sidewalls 315 of the mask features are trimmed down to enlarge the CD thereof, while the thickness of the mask 312 is substantially preserved in each cycle.

Figure 8D:
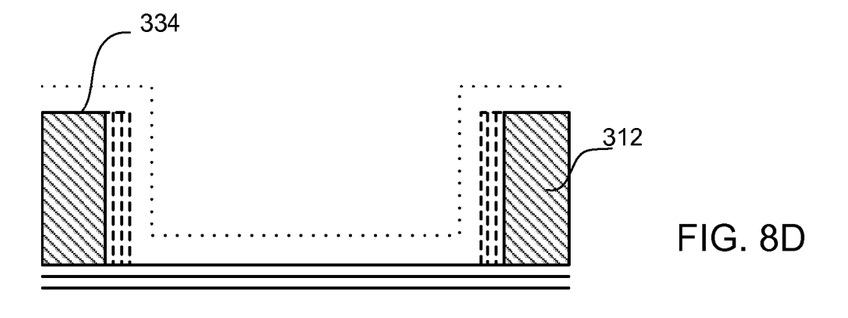

FIG. 8D schematically illustrates a cross sectional view of the mask feature 314 after a plurality of cycles of the mask trimming process. By repeating the deposition phase 108c and the trim-etch phase 110c, the sidewalls 315 of the mask feature is trimmed little by little down to a desired profile. Preferably, the trim-etch phase 110c selectively etches back sidewalls 315 of the mask features in isolate areas with respect to dense areas of the mask features. Thus, in the isolated areas, the sidewalls of the mask features are trimmed down, while in the dense areas the mask features may substantially maintain the original shape.

It should be noted that repeating a plurality of cycles by depositing a thin deposition layer and trimming a small amount of sidewalls in each cycle (multi-cycle process) has several advantages over depositing a thick deposition layer at a time and trim a large amount of the sidewall. First, the multi-cycle process provides better profile tuning. A single long deposition step tends to deposit a thicker polymer layer tends to produce a so called "bread-loaf" profile and in extreme cases the feature may even be pinched off. On the other hand, a single long etch step would produce a faceted profile. A plurality of cycles of alternating deposition step and etching step gives better profile control with minimal or no bread-loafing and straighter side walls. In addition, the polymer layer becomes densified, minimizing delamination, striation, or blistering (peeling-off). For example, a thick deposition layer more than 1000 Å tends to peel off from the mask especially at the edge of the mask features. In addition, it should be noted that it is not desirable or practical to change the CD of the original mask due to the requirement of the design rule.

Additional phases may be added to each cycle. Preferably, the multi-cycle mask trimming process includes at least three cycles. More preferably, this mask trimming process includes four to five cycles.

In accordance with one embodiment of the present invention the deposition phase (step 108c) uses a deposition gas comprising a hydrocarbon component. Preferably, the deposition gas comprises $C_2H_4$. More preferably, the deposition gas further comprises a carrier gas, such as $N_2$. The trim-etch phase (step 110c) uses an etch gas comprising $O_2$.

An example of a deposition gas in the deposition phase (step 108c) provides a flow of 100-500 sccm $C_2H_4$, 100-500 sccm $N_2$, and 10-200 sccm Ar tuning gas. Ar tuning gas may be selectively provided to the edge portion of the wafer to control the uniformity of the deposition process as the deposition phase generally deposits more at the edge of the wafer than the center. The pressure is set to 350-750 mTorr. The substrate is maintained at a temperature of 0-60° C., for example, at about 20° C. The second RF source provides 200-400 Watts at a frequency of 60 MHz. In another example, the deposition phase provides to the chamber a flow of 500 sccm $C_2H_4$, 150 sccm $N_2$, and 150 sccm Ar tuning gas, with a pressure of 740 mTorr and power of 200 Watts or 400 Watts at a frequency of 60 MHz.

An example of the trim-etch phase (step 110c) provides 100-1000 sccm $O_2$. In this example, $O_2$ is the only gas provided during the selective etch phase without tuning gas. $O_2$ tuning gas may be used in trim-etch phase and it can be provided at the edge or center portion depending on the process and chemistry. A pressure of 350-750 mTorr is provided to the chamber. The second RF source provides 200-400 Watts at a frequency of 60 MHz. For example, in accordance with one preferred embodiment, the trim-etch phase provides to the chamber a flow of 750 sccm $O_2$, a pressure of 740 mTorr, and a power of 200 Watts at a frequency of 60 MHz. In accordance with another preferred embodiment, the trim-etch phase provides to the chamber a flow of 750 sccm $O_2$, a pressure of 740 mTorr, and a power of 400 Watts at a frequency of 60 MHz. In accordance with yet another preferred embodiment, the trim-etch phase provides to the chamber a flow of 200 sccm $O_2$, a pressure of 380 mTorr, and a power of 200 Watts at a frequency of 60 MHz.

Returning to FIG. 1, after the trimming of the mask, features are etched into the dielectric layer through the trimmed mask (step 112). The mask 312 and the ARL 310 are then stripped (step 114).

Figure 3D:
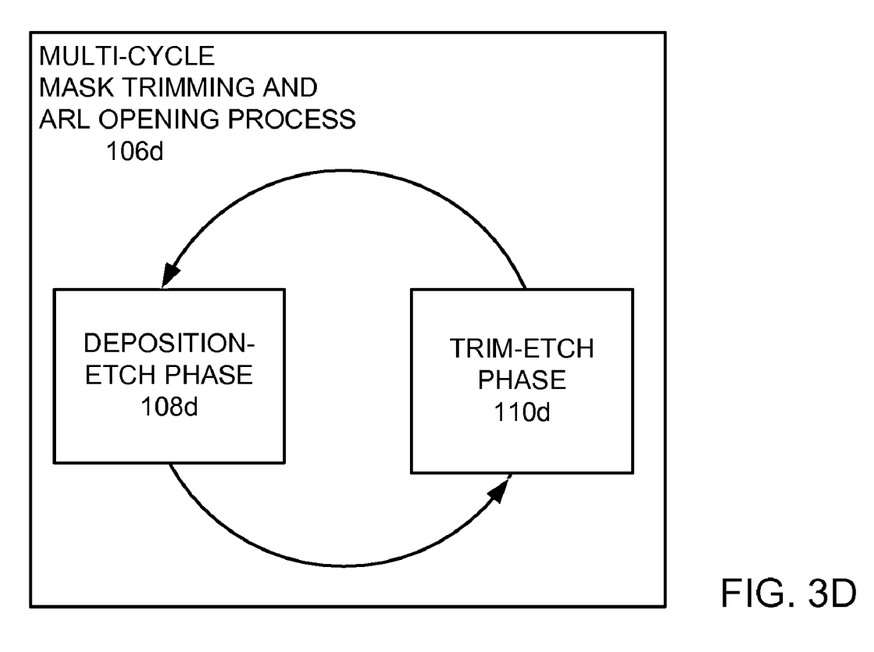
Figure 9A:
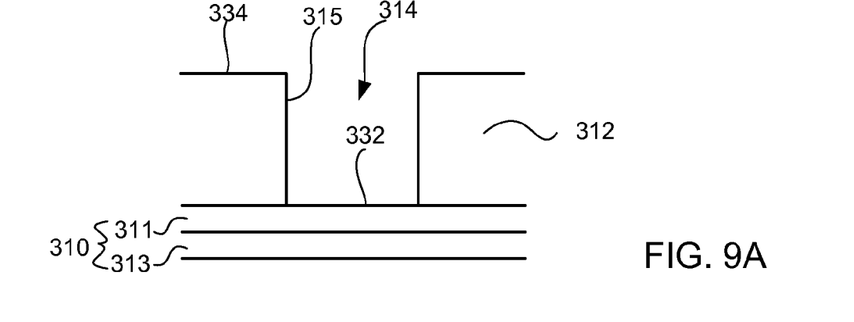
FIGS. 9A-D are schematic cross-sectional views of a mask feature and an ARL processed using a multi-cycle plasma process according to yet another example of the present invention.

FIG. 3D is yet another example of the multi-cycle plasma process 106 that trims the mask and also opens an antireflection layer (ARL) formed in the bottom of the mask features. In this example, as shown in FIG. 9A, the patterned mask 312 is formed over the ARL 310 over the dielectric layer. Typically, the ARL 310 includes an organic BARC 311 and an inorganic DARC 313. The BARC 311 is exposed in the bottom 332 of the mask features.

Figure 9B:
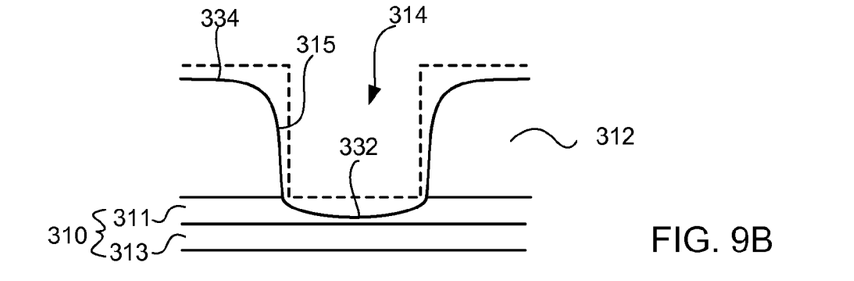
Figure 9C:
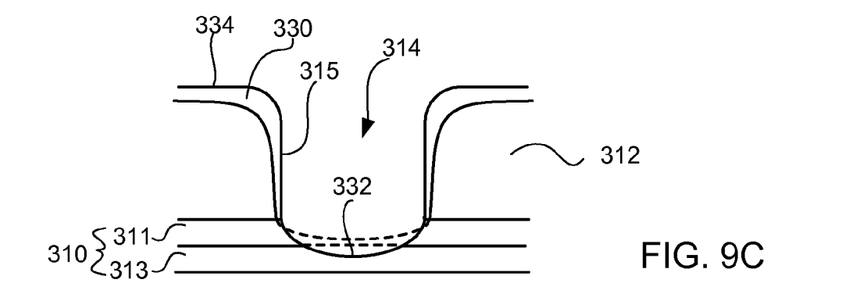

In this example, the shaping phase 110 is a trim-etch phase 110d that first etches the ARL 310 in the bottom 332 of the mask features 314 and trims the PR mask 312 in each cycle, as shown in FIG. 9B. That is, in this example, the trim-etch phase 110d is performed prior to the deposition-etch phase 108d. In the trim-etch phase 110d, the ARL 310 is partially etched and is not completely removed in one cycle. The top 334 of the mask 312 and the side walls 315 of the mask features 314 are also partially removed, as shown in FIG. 9B. The deposition-etch phase 108d then deposits the deposition layer 330 over the PR mask 312 and further etches the ARL 310 in the bottom 332 of the mask features 314 in each cycle, as shown in FIG. 9C. The deposition layer 330 covers the top 334 of the mask features 314 as well as the sidewalls 315 of the mask features 314, while further etching the ARL 310 in the bottom 332 of the mask features 314. The mask trimming and ARL opening process includes two or more cycles, preferably at least three cycles. More preferably, this process includes four to twelve cycles. More preferably, the process repeats six to seven cycles.

Figure 9D:
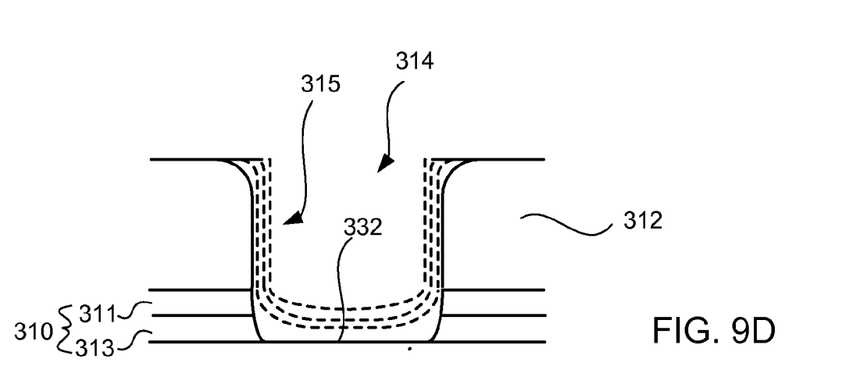

In accordance with one embodiment of the present invention, each deposition-etch phase 108d deposits, on the top 334 of the mask 312, the deposition layer 330 having the thickness substantially the same as the thickness of the mask removed by the previous trim-etch phase 110d, as shown in FIG. 9C. That is, at the end of each cycle, the original thickness of the mask 312 is substantially preserved by the deposition layer 330. However, as to the sidewalls of the mask features 314, the deposition layer 330 on the sidewalls 315 of the mask features 314 (especially in the isolated areas) is not sufficient to fully recover the lost sidewall during the previous trim-etch phase 110d. Accordingly, as shown in FIG. 9C, the multi-cycle plasma process 106d reduces the sidewall of the mask while substantially preserving the original thickness of the mask, resulting in a net trim of the mask. In addition, the ARL 310 in the bottom 332 of the mask features is being etched throughout the trim-etch phase 110d and the deposition-etch phase 108d. Accordingly, as shown in FIG. 9D, by repeating the trim-etch phase 110d and the deposition-etch phase 108d, the sidewalls 315 of the mask features 314 are trimmed little by little down to a desired profile, while the ARL 310 in the bottom 332 of the mask features 314 is opened for the subsequent etch process of the dielectric layer.

Returning to FIG. 1, after the trimming and opening by the multi-cycle plasma process (step 106), features are etched into the dielectric layer through the trimmed mask and opened ARL (step 112). The PR mask may be stripped (step 114).

In accordance with one embodiment of the present invention, the trim-etch phase (step 110d) uses a trim-etch gas comprising $NF_3$. More preferably, the trim-etch gas further comprises a carrier gas, such as $N_2$ and/or Ar. In this embodiment, the deposition-etch phase (step 118d) uses a deposition-etch gas comprising $CF_4$, and deposits a polymer material as the deposition layer. The deposition-etch gas may be a combination of $CF_4$, $H_2$ and Ar, or a combination of $CF_4$, $H_2$, $N_2$ and Ar. The trim-etch gas containing $NF_3$ may have a higher etch rate in isolated areas than dense areas, such that the sidewall of the mask feature in the isolated areas is reduced more than the sidewall of the mask feature in the dense areas. The deposition layer may be a hydrocarbon included polymer (a polymer containing hydrocarbon as a main component).

An example of the trim-etch phase (step 110d) provides a flow of 100-500 sccm, preferably 300 sccm $NF_3$. The pressure is set to 140 mTorr. The substrate is maintained at a temperature of 20° C. Preferably, the second RF source provides 400 Watts at a frequency of 60 MHz. In other embodiments, the second FR source may provide 100-500 Watts at a frequency of 2 MHz, or 100-500 Watts at a frequency of 27 MHz, depending on the wafer and application. In a preferred embodiment, $NF_3$ is the only component of the trim-etch gas without any carrier or tuning gas. In each trim-etch phase, after the $NF_3$-containing trim-etch gas is introduced into the chamber, a trim-etch plasma is formed therefrom to selectively trim the mask and etch the ARL, as described above. The flow of the trim-etch gas is stopped such that the sidewall of the mask features is reduced by a desired amount for the cycle. The amount of the reduced sidewall may be controlled by the time period of the trim-etch phase for a given set the parameters such as gas flow rate, pressure, and the RF power, as well as the thickness of the ARL.

An example of deposition-etch phase (step 108d) provides a $CF_4$ containing gas, such as 20-200 sccm $CF_4$ and 20-200 sccm $H_2$ as a deposition-etch gas, and a carrier gas containing 20-200 sccm $N_2$ and/or 50-500 sccm Ar. Preferably, the deposition-etch gas includes 60 sccm $CF_4$, 70 sccm $H_2$, 30 sccm $N_2$, with the carrier gas of 120 sccm Ar. A pressure of 40-200 mTorr, preferably 80 mTorr is provided to the chamber. The second RF source provides 100-500 Watts, preferably 400 Watts at a frequency of 60 MHz. In other embodiments, the second RF source may provide 100-500 Watts at a frequency of 2 MHz, or 100-500 Watts at a frequency of 27 MHz, depending on the wafer and application.

In other embodiments, each cycle may further include additional deposition and/or profile shaping phases. In each deposition-etch phase, after the $CF_4$-containing etch gas is introduced into the chamber, a plasma is formed therefrom to deposit a deposition layer and further etch the ARL as described above. The flow of the $CF_4$-containing etch gas is stopped such that the deposition layer recovers the thickness of the mask lost in the previous trim-etch phase. The amount of the net trim of the cycle may be controlled by the time period of the trim-etch phase and the deposition-etch phase for a given set the parameters such as gas flow rate, pressure, and the RF power, as well as the thickness of the ARL. In general, the longer the trim-etch phase, the longer the deposition-etch phase. By controlling the two phases of each cycle as well as the number of cycles, at the end of the trimming and opening step, the ARL in the bottom of the mask features are removed and the sidewalls of the features in the isolated areas are trimmed to compensate the micro-loading effect in the subsequent dielectric etch.

In these examples, the plasma processing chamber should be capable of modulating pressure of the chamber, gas flow, gas combinations, RF power, and time duration for each phase.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features in a dielectric layer through a photoresist (PR) mask, the PR mask being patterned using laser light having a wavelength not more than 193 nm, said method comprising:
   pre-treating the PR mask with a noble gas plasma so as to harden the PR mask material by compression without causing chemical reactions; and
   providing a plurality of cycles, wherein each cycle comprises:

a deposition phase that deposits a deposition layer over the PR mask, the deposition layer covering a top and sidewalls of mask features of the PR mask; and
a shaping phase that shapes the deposition layer deposited over the PR mask,
wherein an antireflection layer (ARL) is formed over the dielectric layer below the patterned PR mask, and
wherein in each cycle, the shaping phase first etches the ARL in a bottom of the mask features and trims the PR mask, and the deposition phase deposits the deposition layer on the PR mask and further etches the ARL in the bottom of the mask features.

2. The method as recited in claim 1, wherein the noble gas comprises Ar.

3. The method as recited in claim 1, wherein the pre-treating the PR mask reduces blistering of the PR mask noble and resulting particle contamination during the subsequent plurality of cycles of the deposition and shaping phases.

4. The method as recited in claim 1, wherein the deposition phase provides a high frequency of 60 MHz or greater.

5. The method as recited in claim 4, wherein the deposition phase does not provide RF energy with a frequency less than 50 MHz.

6. The method as recited in claim 1, wherein the shaping phase provides a high frequency of 60 MHz or greater.

7. The method as recited in claim 6, wherein the shaping phase does not provide RF energy with a frequency less than 50 MHz.

8. The method as recited in claim 1, wherein the pre-treating the PR mask comprising:
providing the noble gas;
forming a plasma from the noble gas; and
stopping a flow of the noble gas.

9. The method as recited in claim 8, wherein a gas flow of the noble gas has 100 sccm or greater.

10. The method as recited in claim 8, wherein the forming the plasma comprises:
providing a high frequency of 60 MHz or greater.

11. The method as recited in claim 10, wherein the forming the plasma does not provide RF energy with a frequency less than 50 MHz.

12. The method as recited in claim 10, wherein the forming the plasma further comprises:
providing a power less than 500 W.

13. A method for etching features in a dielectric layer through a photoresist (PR) mask, the PR mask being patterned using laser light having a wavelength not more than 193 nm, said method comprising:
pre-treating the PR mask with a noble gas plasma; and
providing a plurality of cycles, wherein each cycle comprises:
a deposition phase that deposits a deposition layer over the PR mask, the deposition layer covering a top and sidewalls of mask features of the PR mask, wherein the deposition phase also etches features into the dielectric layer, and further deposits the deposition layer on sidewalls of the etched features; and
a shaping phase that shapes the deposition layer deposited over the PR mask, wherein the shaping phase removes the deposition layer.

14. The method as recited in claim 13,
wherein the deposition phase further deposits the deposition layer on a bottom of the mask features,
wherein the shaping phase further removes the deposition layer from the bottom of the mask features without etching the dielectric layer thereunder, leaving sidewalls to shrink a CD of the PR mask, and wherein the method further comprises:
etching the dielectric layer using the PR mask with the CD shrunk by providing the plurality of cycles.

15. The method as recited in claim 13,
wherein deposition phase selectively etches the dielectric layer with respect to the PR mask, and
wherein the shaping phase selectively removes the deposition layer on the sidewalls with respect to the dielectric layer.

16. The method, as recited in claim 15, wherein the deposition-etch phase does not remove the photoresist mask, providing an infinite selectivity.

17. The method as recited in claim 13,
wherein the deposition phase further deposits the deposition layer on a bottom of the mask features,
wherein the shaping phase further removes the deposition layer from the bottom and sidewall of the mask features without etching the dielectric layer thereunder so as to trim the sidewall, and
wherein the method further comprises:
etching the dielectric layer using the PR mask trimmed by providing the plurality of cycles.

18. The method as recited in claim 17,
wherein the shaping phase selectively etches back sidewalls of the mask features in isolate areas with respect to dens areas of the mask features.

19. An apparatus for etching features in a dielectric layer through a photoresist (PR) mask, the PR mask being patterned using laser light having a wavelength not more than 193 nm, the apparatus comprising:
a plasma processing chamber, comprising:
a chamber wall forming a plasma processing chamber enclosure;
a substrate support for supporting a substrate within the plasma processing chamber enclosure;
a pressure regulator for regulating the pressure in the plasma processing chamber enclosure;
at least one electrode for providing power to the plasma processing chamber enclosure for sustaining a plasma;
a gas inlet for providing gas into the plasma processing chamber enclosure; and
a gas outlet for exhausting gas from the plasma processing chamber enclosure;
a gas source in fluid connection with the gas inlet, comprising:
an etch gas source;
a deposition phase gas source;
a shaping phase gas source; and
a pretreatment gas source; and
a controller controllably connected to the gas source and the at least one electrode, comprising:
at least one processor; and
non-transitory computer readable media, comprising:
computer readable code for pre-treating the PR mask with a noble gas plasma, comprising:
computer readable code for providing a noble gas from the pretreatment gas source;
computer readable code for forming a plasma from the noble gas; and
computer readable code for stopping a flow of the noble gas; and
computer readable code for providing a plurality of cycles, each cycle including a deposition phase and a shaping phase, the computer readable code comprising:

computer readable code for providing a deposition phase gas from the deposition phase gas source;

computer readable code for forming a plasma from the deposition phase gas so as to deposit a deposition layer over the PR mask, the deposition layer covering a top and sidewalls of mask features of the PR mask, wherein the plasma from the deposition phase gas also etches features into the dielectric layer, and further deposits the deposition layer on sidewalls of the etched features;

computer readable code for stopping a flow of the deposition phase gas;

computer readable code for providing a shaping phase gas from the shaping phase gas source;

computer readable code for forming a plasma from the shaping phase gas so as to shape the deposition layer deposited over the PR mask, wherein the plasma from the shaping phase gas removes the deposition layer; and computer readable code for stopping a flow of the shaping phase gas.

* * * * *